United States Patent [19]
Montesano

[11] Patent Number: 5,459,923
[45] Date of Patent: Oct. 24, 1995

[54] METHOD OF MARKING HERMETIC PACKAGES FOR ELECTRICAL DEVICE

[75] Inventor: Mark J. Montesano, Fairfax, Va.

[73] Assignee: E-Systems, Inc., Dallas, Tex.

[21] Appl. No.: 98,057

[22] Filed: Jul. 28, 1993

[51] Int. Cl.⁶ .................................................. H01R 43/16
[52] U.S. Cl. ........................ 29/874; 29/829; 106/1.12; 156/89; 264/61
[58] Field of Search .................. 29/829, 830; 264/61; 428/901

[56] References Cited

U.S. PATENT DOCUMENTS

| | | | |
|---|---|---|---|
| 3,852,877 | 12/1974 | Ahn et al. | 29/830 X |
| 4,109,377 | 8/1978 | Blazick et al. | 264/61 X |
| 4,799,958 | 1/1989 | Morris et al. | |
| 4,861,641 | 8/1989 | Foster et al. | 106/1.12 X |
| 4,940,849 | 7/1990 | Morris et al. | 428/901 X |
| 5,011,725 | 4/1991 | Foster | 156/89 X |
| 5,029,242 | 7/1991 | Sammet | 264/61 X |
| 5,194,196 | 3/1993 | Chance | 264/61 X |
| 5,200,249 | 4/1993 | Dolhert et al. | 428/901 X |
| 5,229,549 | 7/1993 | Yamakawa et al. | |

FOREIGN PATENT DOCUMENTS

| | | | |
|---|---|---|---|
| 3-46298 | 2/1991 | Japan | 29/829 |

*Primary Examiner*—Carl J. Arbes
*Attorney, Agent, or Firm*—Rogers & Killeen

[57] ABSTRACT

A device and method of manufacture for producing electrically conductive regions in hermetically sealed insulative plates or hermetically sealed electronic component enclosures. The electrically conductive regions consist of a monolithic composite material comprising particles of an insulative material and a conductive metal. The material of the insulative particles, their size, and the type of conductive metal used are selected so that the coefficient of thermal expansion (CTE) of the resulting electrically conductive region approximates the CTE of the surrounding material.

29 Claims, 1 Drawing Sheet

1

METHOD OF MARKING HERMETIC PACKAGES FOR ELECTRICAL DEVICE

BACKGROUND OF THE INVENTION

This invention relates to hermetically seared electrical component mounting prates and enclosures. In particular, the invention is a method of creating a hermetically sealed electrical component enclosure or mounting plate having electrically conductive regions passing through the enclosure walls or the plate such that the hermetic seal will not be bleached during thermal cycling.

There has long been a need to provide hermetically sealed enclosures for electrical components in order to protect the electrical components from damaging environmental conditions such as moisture and airborne dust. Electrical components and electrical circuits mounted in hermetically sealed enclosures are often used in equipment which is subjected to wide temperature and pressure variations. For instance, when electrical components are used on an aircraft which rises from ground level into the upper atmosphere the temperature can drop more than a hundred degrees fahrenheit. These temperature variations, particularly when repeated, often create problems with the seal between electrically conductive regions in the electrical component enclosures as discussed below.

The most common method of creating electrically conductive regions in a sealed electrical component enclosure is to cut apertures in one or more of the enclosure walls and fill the apertures with an electrically conductive metal. This method has a severe limitation because the electrically conductive metal generally has a coefficient of thermal expansion (CTE) greater than the CTE of the enclosure material. When the ambient temperature changes from one temperature to a lower temperature, the electrically conductive metal will contract more than the surrounding wall material and will tend to pull away from the walls creating a breach. When the ambient temperature changes from one temperature to a higher temperature, the electrically conductive metal will expand more than the wall material and will tend to cause the walls to crack. In each of these situations, the hermetic seal which exists between the electrically conductive region and the surrounding walls is often breached, particularly with repetition.

The prior art discloses several methods of creating an electrically conductive region in an electrical component mounting material which does not require the use of an aperture filled with a conductive metal. One method is to use a typical semiconductor substrate material and highly dope portions of material such that electrically conductive regions are created in the material. Another method is known as thermal gradient zone melting as disclosed in U.S. Pat. No. 4,170,490 to Anthony, et al.

Each of these methods are difficult to accomplish and generally results in a high failure rate. Consequently, for each of these methods the cost of production is relatively high.

It is accordingly an object of the present invention to obviate many of the problems of the prior art and to provide a novel low cost hermetically sealed mounting plate or electrical component enclosure which can withstand thermal cycling without breach of the hermetic seal.

It is another object of the present invention to provide a novel and reliable method creating electrically conductive regions in insulative materials.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
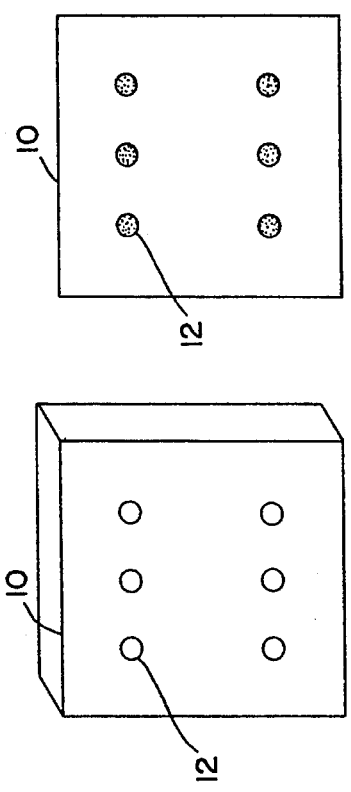
FIG. 1 shows a pictorial view of an insulative plate with apertures cut through the plate.

A method of producing a hermetically sealed electrical component mounting enclosure will be described with references to FIGS. 1–5. With reference to FIG. 1, an electrically insulative plate 10 has apertures 12 cut there through by an appropriate method such as laser drilling. The apertures 12 are arranged in a pattern which corresponds to the leads of an electrical component or an electronic module which is to be mounted on the plate 10.

Figure 2:
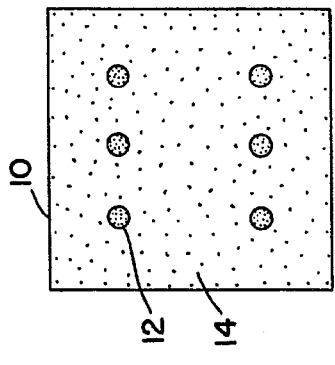
FIG. 2 is a top plan view of the plate of FIG. 1 after the apertures have been filled with particles of a low CTE material.

With reference to FIG. 2, the apertures 12 which were formed in the previous step are then filled with particles of a material having a coefficient of thermal expansion (CTE) substantially smaller than the coefficient of thermal expansion of conductive metals and smaller than the insulative plate. Although other materials can be used, particles of silicon carbide, tungsten, silica glass, graphite and diamond have all been found to be effective in the present invention.

Since materials having a CTE smaller than the CTE of conductive metals are almost always insulative, for purposes of this description the particles which are impregnated with a conductive metal to form the electrically conductive regions will be referred to as "insulative particles". This should in no way be construed as a limitation that the particles be electrically insulative.

The insulative particles can be of varying sizes and are typically in the range of 1–60 microns. The particles can be bound with a dilute solution of latex, wax or other suitable binder to keep them in place until impregnation.

Figure 3:
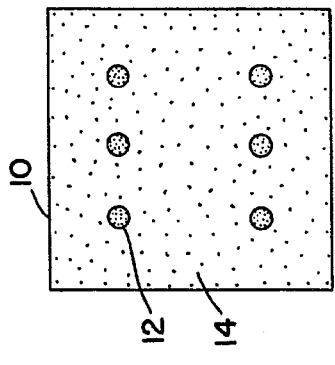
FIG. 3 is a plan view of the plate of FIG. 2 after it has been subjected to pressure infiltration of a conductive metal.

With reference to FIG. 3. The insulative plate 10 with apertures 12 filled with insulative particles is then subjected to pressure infiltration of a liquid conductive metal. The pressure infiltration step is typically carried out by placing the apertured plate inside a mold and injecting an electrically conductive liquid metal into the mold under pressure sufficient to cause the liquid metal to fully infiltrate the particle filled apertures. Because it is necessary that the conductive metal be in a liquid form, the temperatures can be quite high.

The liquid metal can be injected at pressures of 1,500 psi or greater. Once the liquid metal has fully mixed with the insulative particles in the apertures 12, the plate is allowed to cool and is removed from the mold.

After the conductive metal has solidified, the metal and the insulative particles in the apertures 12 form a monolithic composite material which is electrically conductive and is bonded to the walls of the apertures 12 by metal. The bond between the monolithic composite material and the walls of the apertures provides a hermetic seal.

Selecting the material type and size of the insulative particles as well as the type of conductive metal used allows one to tailor the CTE of the resultant composite material. The CTE of the composite material can be matched to the CTE of the plate so that when thermal cycling occurs, both the plate 1 and the electrically conductive regions 12 will expand and contract at substantially the same rate, and the seal between the electrically conductive regions 12 and the plate 10 will not be breached.

As shown in FIG. 3, the mold used in the pressure infiltration step can be constructed such that the electrically conductive metal is also allowed to adhere to the surfaces of the plate 10, such that when the plate is removed from the mold the conductive metal is also impregnated into the surface of the plate 10 to a depth less than the thickness of the plate, e.g., a thin surface layer only.

Figure 4:
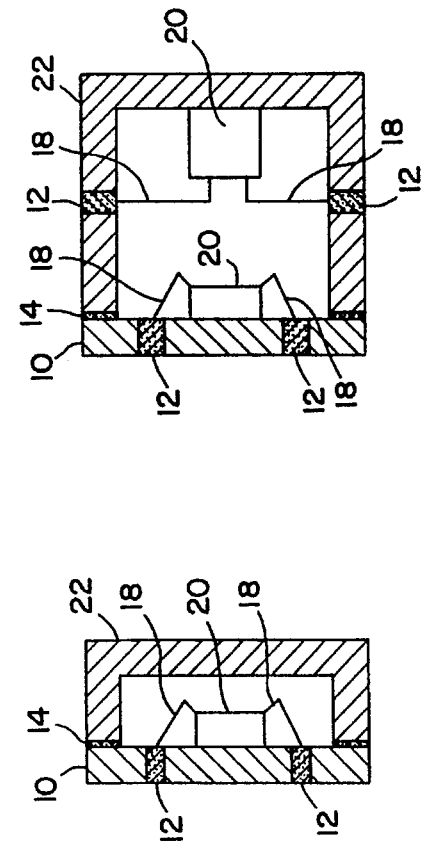
FIG. 4 is a plan view of the plate of FIG. 3 after some of the electrically conductive metal has been removed from the surface of the plate.
Figure 5:
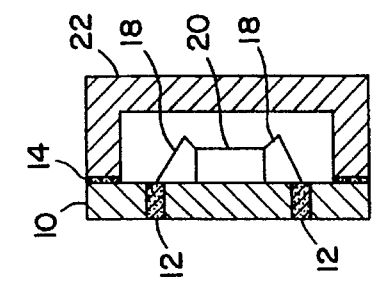
FIG. 5 is an elevational view of the plate of FIG. 4 in cross-section taken through lines 5—5 of FIG. 4, illustrating the plate with a cover to form a sealed electrical component mounting enclosure.

With reference to FIG. 4, unwanted conductive metal may then be removed from the surface of the plate 10 using an appropriate method such as chemical etching or abrasion. The result, as shown in FIG. 4, is that the insulative plate 10 has a ring of conductive metal 14 around the periphery of one side of the plate 10 and the apertures 12 are filled with a monolithic comprised material composed of the insulative particles and the conductive metal. The conductive metal on the surface of the plate 10 is removed from the areas surrounding the apertures 12 to create a clear area 16 which has no conductive metal on the surface of the plate 10. This prevents the conductive regions from being electrically connected via the conductive metal impregnated on the surface of the plate 10.

The plate 10 having electrically conductive regions 12 as shown in FIG. 4 can be used by itself whenever it is desirable to have a hermetically sealed insulative plate with electrically conductive regions therethrough. However, and with reference to FIG. 5, one or more electrical components 20 may be mounted on the interior of the plate formed according to the previous steps, and the electrical leads 18 of the electrical components 20 are attached to the electrically conductive regions 12. If so desired, a cover 22 can be attached to the plate 10 using the ring of conductive material 14 of FIG. 4. If the material of the cover 22 and the plate 10 have the same CTE, the entire electrical mounting enclosure will expand and contract at the same rate during thermal cycling and no breach of the seal will occur.

The cover 22 may also be attached to the base plate 10 using any other appropriate method which allows for a hermetic seal therebetween.

Figure 6:
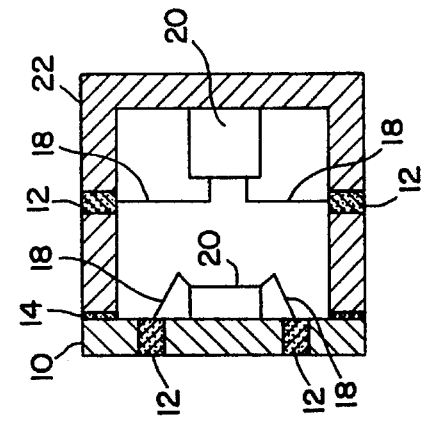
FIG. 6 is an elevational view in cross-section of a second embodiment of a sealed electrical component mounting enclosure having multiple components mounted therein and having electrically conductive regions passing through multiple walls of the enclosure.

Plates produced according to the steps outlined above can be combined to produce hermetically sealed electrical mounting enclosures having electrically conductive regions extending through multiple walls of the enclosure as shown in FIG. 6.

ADVANTAGES AND SCOPE OF THE INVENTION

The method and device disclosed in the present invention has an advantage over a simple aperture filled with a conductive metal in that the CTE of the electrically conductive region of the present invention matches the CTE of the surrounding material so that thermal cycling is less likely to cause a breach of the seal between the electrically conductive region and the surrounding material.

The device and method of the present invention also has advantages over the thermal gradient zone melting technique and the doping of a semiconductor substrate technique in that it is cheaper, results in less waste in the production process, and provides a lower electrical resistive path.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of making a hermetically sealed enclosure for an electrical device having conductive paths extending therethrough, comprising the steps of:
   a. providing an apertured enclosure of insulative material;
   b. filling the apertures with a plurality of low CTE insulative particles;
   c. binding the insulative particles in place in the apertures with a binder;
   d. impregnating the filled apertures with a liquid conductive material at a pressure sufficient to displace the binder; and
   e. solidifying the conductive material to form monolithic conductive paths within the apertures which are hermetically sealed to said enclosure.

2. The method of claim 1 further comprising the step of selecting the size of the insulative particles such that the CTE of the conductive paths approximates the CTE of the enclosure.

3. The method of claim 1 further comprising the steps of selecting the liquid conductive material and the low CTE particles such that the CTE of the conductive paths approximates the CTE of the enclosure.

4. The method of claim 1 wherein the particles consist of one or more of the group consisting of silicon carbide, tungsten, silica glass, graphite and diamond, and
   wherein the conductive material consists of one or more of the materials in the group consisting of copper, lead, tin, aluminum, gold, silver, and iron.

5. The method of claim 1 wherein the liquid conductive material impregnates the filled apertures at approximately 1500 psi or greater.

6. The method of claim 5 wherein the liquid conductive material impregnates the filled apertures from one side of the apertures.

7. The method of claim 5 wherein the liquid conductive material impregnates the apertures from both sides of the apertures.

8. The method of claim 1 comprising the further step of impregnating the surface of the enclosure with the liquid conductive material to a depth less than the thickness of the enclosure walls.

9. The method of claim 8 comprising the further step of attaching a cover to the enclosure using the conductive material impregnated in the surface of the enclosure walls.

10. The method of claim 1 wherein the binder is a solution of latex or wax.

11. The method of claim 1 further comprising the steps of:
   placing the enclosure in a mold prior to said impregnating step; and
   removing the enclosure from the mold after said solidifying step.

12. A method of reducing the failure of a hermetic seal between an insulative plate and conductive paths therethrough responsive to thermal cycling, comprising the steps of:
   a. providing an apertured plate of insulative material having a first CTE;
   b. filling the apertures with a plurality of insulative particles that are bound with latex or wax and that have a CTE lower than the CTE of the plate and lower than a CTE of a electrically conductive metal that will be impregnated into the filled apertures;
   c. subjecting the apertured plate to liquid metal under pressure sufficient to cause the metal to displace the latex or wax and to impregnate the apertures so that upon solidification, sealed electrically conductive paths will connect the top and bottom of the plate through the apertures; and
   d. solidifying the metal to form with the particles an electrically conductive monolithic composite which has a CTE closer to the CTE of the insulative plate than the CTE of the metal,
to thereby reduce the failure of a seal between an insulative plate and conductive paths therethrough responsive to thermal cycling.

13. The method of claim 12 wherein the liquid metal is applied to both sides of the plate and impregnates the surfaces of the plate to a depth less than one-half the thickness of the plate.

14. The method of claim 12 comprising the further step of selecting low CTE particles which have a diameter of between about 1 and about 60 microns.

15. A method of making a sealed enclosure for an electrical device, the enclosure having electrically conductive vias therethrough, the method comprising the steps of:
   (a) providing an apertured electrically insulative plate forming a base of the enclosure;
   (b) filling the apertures with a mixture of (i) particles that have a CTE lower than the CTE of the plate and lower than a CTE of an electrically conductive material that will impregnate the apertures, and (ii) a binder for holding the particles in place in the apertures;
   (c) pressurally impregnating the filled apertures with a liquid electrically conductive material at a pressure sufficient to displace the binder, the electrically conductive material and the particles forming a composite material having a CTE that substantially matches the CTE of the plate, the composite material forming the electrically conductive vias; and
   (d) providing a cover for the plate to provide a sealed enclosure.

16. The method of claim 15 wherein the step of impregnating comprises the step of placing the plate with the filled apertures into a mold before impregnating the filled apertures.

17. The method of claim 15 further comprising the step of impregnating the electrically conductive material into a surface of the plate to form a peripheral area to which the cover is attached.

18. The method of claim 15 wherein the cover is apertured and is the same material as the electrically insulative plate and repeating steps (b) and (c) to fill and impregnate the apertures in the cover.

19. The method of claim 15 wherein the particles consist of one or more of the particles from the group consisting of silicon carbide, tungsten, silica glass, graphite and diamond.

20. The method of claim 15 wherein the binder is a solution of latex or wax.

21. A method of making an insulative plate with electrically conductive regions therethrough comprising the steps of:
   a. providing an apertured plate of insulative material;
   b. filling the apertures with a plurality of insulative particles each having a CTE smaller than both a conductive material and the plate of insulative material;
   c. binding the insulative particles in a binder suitable for holding the particles in place;
   d. pressurally impregnating the apertures with the conductive material at a pressure sufficient to displace the binder; and
   e. solidifying the conductive material to form monolithic conductive paths within the apertures.

22. The method of claim 21 wherein the insulative particles are between 1 and 60 microns in diameter.

23. The method of claim 21 wherein the insulative particles are one or more from the group of silicon carbide, tungsten, silica glass, graphite, and diamond.

24. The method of claim 21 wherein the apertures are impregnated with liquid conductive material at a pressure of at least 1500 psi.

25. A method for creating electrically conductive regions in insulative material comprising the steps of:
   a. forming vacancies in the insulative material by removing portions of the insulative material where an electrically conductive region is desired;
   b. depositing insulative particles in the vacancies;
   c. holding the insulative particles in place in the vacancies with a binder;
   d. pressurally impregnating the vacancies with a liquid conductive material at a pressure sufficient to displace the binder; and
   e. solidifying the liquid conductive material to form a monolithic material.

26. The method of claim 25 wherein the vacancies are impregnated with liquid conductive material at a pressure of at least 1500 psi.

27. A method of making a hermetically sealed enclosure for an electrical device having conductive paths extending therethrough, comprising the steps of:
   providing an apertured enclosure of insulative material;
   b. filling the apertures with a plurality of low CTE particles that are held in place in the apertures with a binder;
   c. impregnating the filled apertures with a liquid conductive material at a pressure of approximately 1500 psi or greater; and
   d. solidifying the conductive material to form monolithic conductive paths within the apertures which are hermetically sealed to said enclosure.

28. The method of claim 27 comprising the further step of impregnating the surface of the enclosure with the liquid conductive material to a depth less than the thickness of the enclosure walls.

29. The method of claim 27 wherein the binder is latex or wax and comprising the further step of binding the low CTE particles with the latex or wax prior to impregnating the filled apertures with the liquid material.

* * * * *